(12) United States Patent
Seong et al.

(10) Patent No.: US 9,929,218 B2
(45) Date of Patent: Mar. 27, 2018

(54) ORGANIC LIGHT EMITTING DISPLAY APPARATUS AND THIN FILM DEPOSITION MASK FOR MANUFACTURING THE SAME

(71) Applicant: LG Display Co., Ltd., Seoul (KR)

(72) Inventors: DeokKyeong Seong, Paju-si (KR); JiHo Park, Seoul (KR); SeongBoo Jeong, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/959,706

(22) Filed: Dec. 4, 2015

(65) Prior Publication Data

US 2016/0163775 A1     Jun. 9, 2016

(30) Foreign Application Priority Data

Dec. 8, 2014 (KR) .......... 10-2014-0175061

(51) Int. Cl.
*H01L 27/32* (2006.01)
*C23C 14/04* (2006.01)
*H01L 51/00* (2006.01)

(52) U.S. Cl.
CPC ........ *H01L 27/3223* (2013.01); *C23C 14/042* (2013.01); *H01L 51/0011* (2013.01)

(58) Field of Classification Search
CPC .................................. H01L 27/3223
See application file for complete search history.

(56) References Cited

U.S. PATENT DOCUMENTS

| 2003/0137242 A1* | 7/2003 | Seki .................... H01L 27/3246 313/506 |
| 2004/0124781 A1 | 7/2004 | Bae et al. |
| 2005/0194893 A1* | 9/2005 | Lee .................... H01L 51/0005 313/504 |
| 2010/0003812 A1 | 1/2010 | Eldershaw |
| 2010/0013853 A1 | 1/2010 | Takatori |
| 2015/0129851 A1* | 5/2015 | Lee .................... H01L 51/5262 257/40 |

FOREIGN PATENT DOCUMENTS

| CN | 1514679 A | 7/2004 |
| CN | 101097910 A | 1/2008 |
| CN | 101442068 A | 5/2009 |
| CN | 101577071 A | 11/2009 |
| JP | 2000-150344 A | 5/2000 |

\* cited by examiner

*Primary Examiner* — Fernando L Toledo
*Assistant Examiner* — Valerie N Newton
(74) *Attorney, Agent, or Firm* — Dentons US LLP (57) ABSTRACT

Provided is an organic light emitting display apparatus. The organic light emitting display apparatus includes a substrate having a light emitting area and a bezel area surrounding the light emitting area; and an organic light emitting element. The organic light emitting element includes an organic layer disposed in a plurality of columns in the light emitting area on the substrate. Each of the plurality of columns includes a different number of pixels disposed therein. The organic layer corresponds to the plurality of columns.

13 Claims, 6 Drawing Sheets

ORGANIC LIGHT EMITTING DISPLAY APPARATUS AND THIN FILM DEPOSITION MASK FOR MANUFACTURING THE SAME

CROSS-REFERENCE TO RELATED APPLICATIONS

This application claims the priority of Korean Patent Application No. 2014-0175061 filed on Dec. 8, 2014, in the Korean Intellectual Property Office, the disclosure of which is incorporated herein by reference.

BACKGROUND OF THE INVENTION

Field of the Invention

The present disclosure relates to an organic light emitting display apparatus and a thin film deposition mask for manufacturing the same. More particularly, the present disclosure relates to organic light emitting display apparatuses of various shapes and a thin film deposition mask for manufacturing the same.

Description of the Related Art

In order to manufacture electronic devices of various shapes, display apparatuses having various shapes have been developed. Particularly, an organic light emitting display (OLED) apparatus is a self-light emitting display apparatus that does not need a separate light source, unlike a liquid crystal display (LCD) apparatus. Thus, the organic light emitting display apparatus can be easily manufactured into various shapes. Further, the organic light emitting display apparatus can be manufactured into a lightweight and slim profile, as compared with the liquid crystal display apparatus. Therefore, the organic light emitting display apparatus has an advantage of being applied to electronic devices of various shapes.

Further, the organic light emitting display apparatus is advantageous in terms of power consumption since it is driven with a low voltage. Also, the organic light emitting display apparatus has a high response speed, a wide viewing angle, and a high contrast ratio.

An organic layer configured to emit light in an organic light emitting display apparatus is made of an organic material. Further, the organic layer is formed on a substrate of the organic light emitting display apparatus by various methods. As a method for forming an organic material, there may be employed a method of using a metal mask having high durability and strength in order to form an organic layer of a desired shape in a short time.

In order to manufacture organic light emitting display apparatuses of various shapes other than a rectangular shape, a metal mask including a slit for forming an organic layer of a desired shape is needed. However, a size and a position of the slit of the metal mask may be changed from those of a conventional rectangular structure in order to have various shapes. In this case, there is a problem of a considerable decrease in thickness uniformity of the organic layer.

SUMMARY OF THE INVENTION

An organic light emitting display apparatus of the prior art has a rectangular shape. Thus, pixels are disposed as a plurality of columns having the same length. However, in organic light emitting display apparatuses of various other shapes, for example, a circular organic light emitting display apparatus, pixels are disposed as a plurality of columns having different lengths.

In order to form an organic layer into a plurality of columns, a method of using a mask including slits having the same length and that is used to manufacture a rectangular organic light emitting display apparatus may be used. Further, a method of using a mask including slits corresponding to the plurality of columns may be used.

If the mask including the slits having the same length is used, an organic layer may be formed to have uniform thickness. Further, the organic layer can be universally applied to organic light emitting display apparatuses of various shapes. However, a material of the thus formed organic layer may be additionally formed on an unwanted area.

If the material of the organic layer is additionally formed on the unwanted area, a current passing through the organic layer may leak to the additionally formed material of the organic layer. Further, conductive materials may be short-circuited by conductive materials of the organic layer.

If the mask including the slits corresponding to the plurality of columns is used, an organic layer may be formed on a wanted area. However, there may be a decrease in thickness uniformity of the organic layer. In particular, if adjacent slits have different lengths, there may be a decrease in thickness uniformity of an organic layer formed through a longer slit.

An object to be achieved by the present disclosure is to provide a non-rectangular organic light emitting display apparatus and a thin film deposition mask for manufacturing the same. In the organic light emitting display apparatus, formation of a material of an organic layer on an unwanted area is minimized and also, the organic layer has a high thickness uniformity.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display apparatus. The organic light emitting display apparatus includes: a substrate including a light emitting area and a bezel area surrounding the light emitting area; and an organic light emitting element. The organic light emitting element includes an organic layer and is disposed in a plurality of columns in the light emitting area on the substrate. Each of the plurality of columns includes a different number of pixels disposed therein. The organic layer is disposed to correspond to the plurality of columns.

According to another feature of the present disclosure, the organic light emitting display apparatus further includes a dummy organic layer. The dummy organic layer is disposed parallel to the plurality of columns and has the same length as an organic layer in the outermost column of the plurality of columns.

According to yet another feature of the present disclosure, the dummy organic layer is formed of the same material as the organic layer.

According to still another feature of the present disclosure, the dummy organic layer is on both sides of the organic layer in the outermost column.

According to still another feature of the present disclosure, the plurality of columns is disposed such that the number of the pixels is increased toward the plurality of columns at center.

According to still another feature of the present disclosure, the light emitting area has a circular shape.

According to still another feature of the present disclosure, the light emitting area has a polygonal shape.

According to another aspect of the present disclosure, there is provided a thin film deposition mask. The thin film deposition mask includes: a base; and a slit portion. The slit portion includes a plurality of slits penetrating the base, having different lengths, and formed in parallel to each other.

According to another feature of the present disclosure, the slit portion further includes at least one dummy slit which is parallel to the plurality of slits and has the same length as the outermost slit of the plurality of slits.

According to yet another feature of the present disclosure, the at least one dummy slit is on both sides of the plurality of slits.

According to still another feature of the present disclosure, the plurality of slits is disposed such that lengths of the plurality of slits are increased toward the plurality of slits at a center.

According to still another feature of the present disclosure, the slit portion has a circular shape.

According to still another feature of the present disclosure, the slit portion has a polygonal shape.

According to still another feature of the present disclosure, the thin film deposition mask further includes a buffer adjacent to the slit portion.

By using a thin film deposition mask of the present disclosure, it is possible to realize uniform thickness of an organic layer in non-rectangular organic light emitting display apparatuses of various shapes. Accordingly, it is possible to provide an organic light emitting display apparatus improved in reliability.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 1:
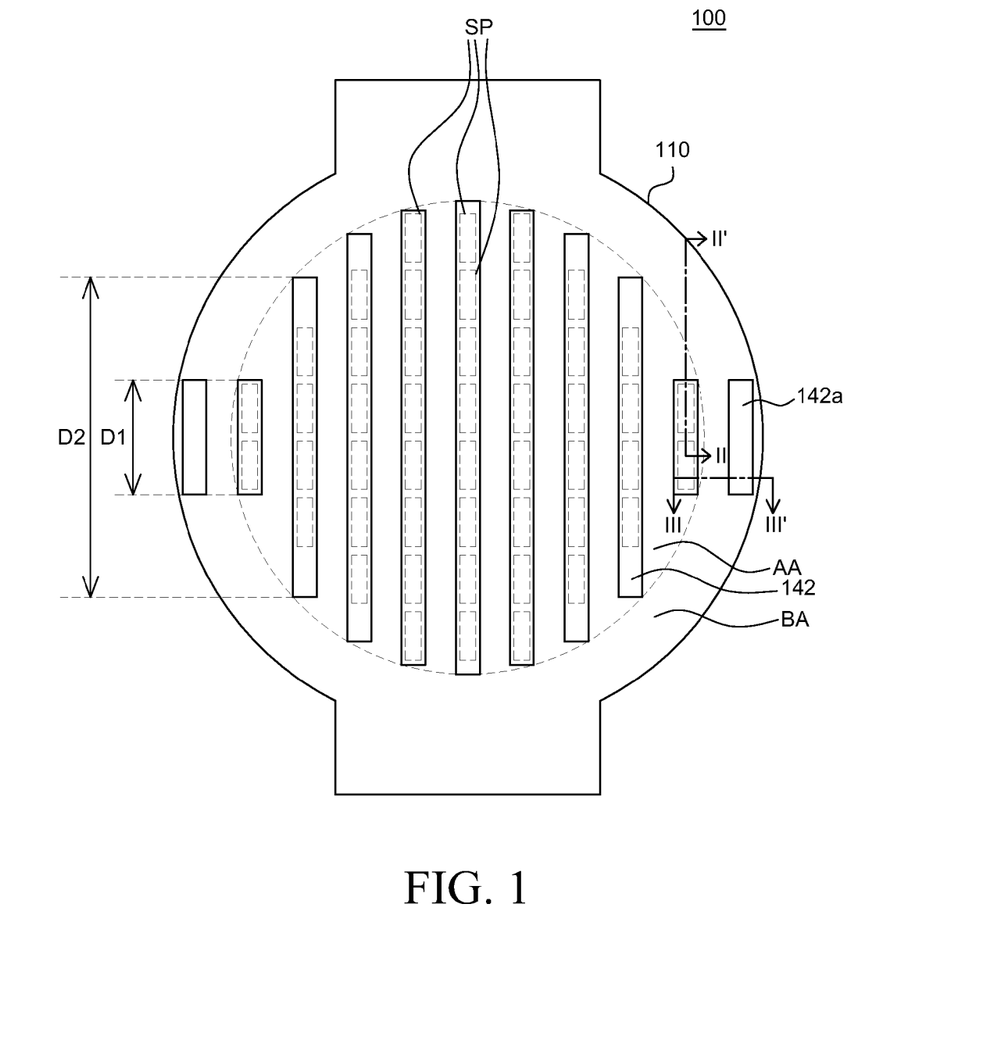
FIG. 1 is a schematic plan view of an organic light emitting display apparatus according to an exemplary embodiment of the present disclosure.
Figure 2:
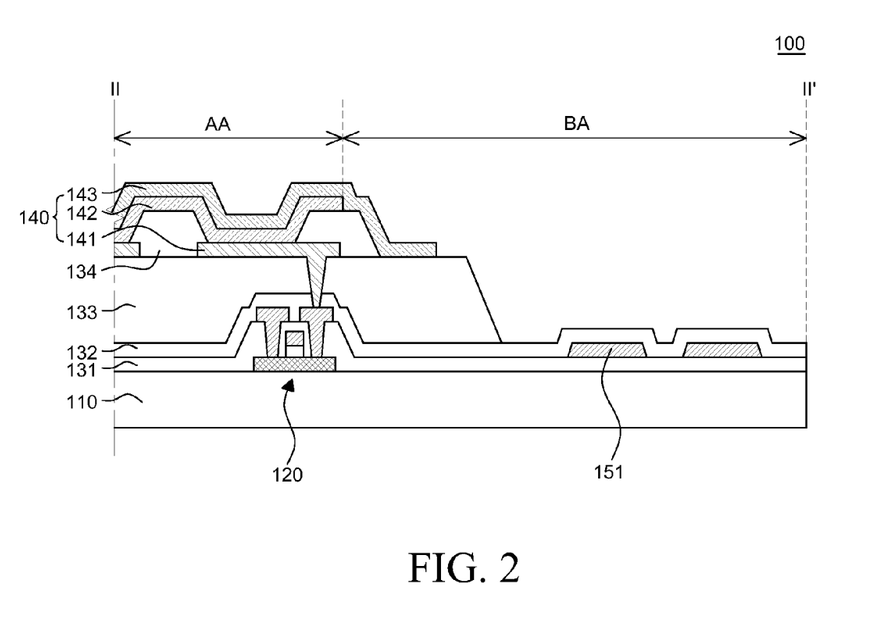
FIG. 2 is a schematic cross-sectional view of the organic light emitting display apparatus taken along a line II-IF of FIG. 1.
Figure 3:
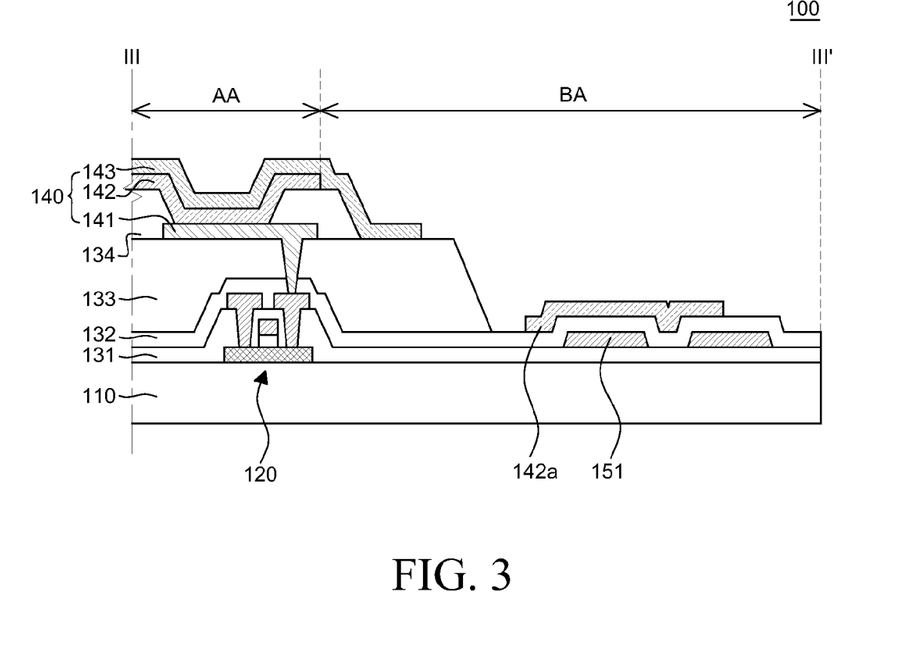
FIG. 3 is a schematic cross-sectional view of the organic light emitting display apparatus taken along a line III-III' of FIG. 1.

FIG. 1 is a schematic plan view of an organic light emitting display apparatus according to an exemplary embodiment of the present disclosure. FIG. 2 is a schematic cross-sectional view of the organic light emitting display apparatus taken along a line II-IF of FIG. 1. FIG. 3 is a schematic cross-sectional view of the organic light emitting display apparatus taken along a line III-III' of FIG. 1. For convenience in explanation, FIG. 1 illustrates only a part of an organic layer 142 and a dummy organic layer 142a on a substrate 110. Referring to FIG. 1 to FIG. 3, an organic light emitting display apparatus 100 includes the substrate 110, a thin film transistor 120, and a overcoat layer 133. The organic light emitting display apparatus 100 further includes an organic light emitting element 140 including the organic layer 142, the dummy organic layer 142a, and a wiring 151.

The organic light emitting display apparatus 100 is a top emission type in which light emitted from the organic layer 142 is released toward an upper side of the substrate 110 on which the thin film transistor 120 is formed.

The substrate 110 supports various elements formed on the substrate 110. Referring to FIG. 1, the substrate 110 has a partially circular shape when viewed from above. FIG. 1 illustrates the substrate 110 of the organic light emitting display apparatus 100 which can be applied to a watch-type electronic device, as an example, but is not limited thereto. The substrate 110 may have a fully circular shape or other various polygonal shapes instead of the partially circular shape.

Referring to FIG. 1 and FIG. 2, the substrate 110 includes a light emitting area AA and a bezel area BA. The light emitting area AA includes a plurality of sub-pixel areas SP where the organic light emitting element 140 is formed. The light emitting area AA is defined by the formed organic layer 142. To explain the organic layer 142 formed by using a thin film deposition mask according to an exemplary embodiment of the present disclosure, FIG. 1 illustrates deposition of the organic layer 142 of one color. That is, the plurality of sub-pixel areas SP illustrated in FIG. 1 is sub-pixel areas SP for one color. The bezel area BA is an area surrounding the light emitting area AA and formed along an outer edge of the substrate 110. Further, in the bezel area BA, a circuit unit and the wiring 151 for driving the organic light emitting element 140 are disposed.

The substrate 110 may be formed of an insulating material. For example, the substrate 110 may be formed of a flexible material. The flexible material may include polyimide (PI), polyetherimide (PEI), polyethylene terephthalate (PET), polycarbonate (PC), polymethylmethacrylate (PMMA), polystyrene (PS), styrene acrylonitrile copolymer (SAN), silicon-acryl resin, and the like.

The thin film transistor 120 including an active layer, a gate electrode, a source electrode, and a drain electrode is formed on the substrate 110. The gate electrode and the active layer are insulated by a gate insulation layer. The gate electrode, the source electrode and the drain electrode are insulated by an interlayer insulation layer 131. The thin film transistor 120 is not limited thereto, and thin film transistors having various structures, for example, a coplanar structure or a bottom gate structure, may be used. The organic light emitting display apparatus 100 may include various wirings formed of the same material as the source electrode and the drain electrode, or the gate electrode.

A passivation layer 132 is formed on the thin film transistor 120 to cover an exposed part of the source electrode, drain electrode and active layer. The passivation layer 132 is configured to protect the constituent elements of the thin film transistor 120 from moisture or oxygen. Referring to FIG. 2, the passivation layer 132 is formed extending from the light emitting area AA toward the bezel area EA→BA of the substrate 110. Further, the passivation layer 132 is formed on the entire surface of the substrate 110 to cover the wiring 151.

The overcoat layer 133 is formed on the passivation layer 132. The overcoat layer 133 includes a contact hole through which at least a part of the drain electrode or source electrode of the thin film transistor 120 is exposed. The organic light emitting element 140 including an anode 141, the organic layer 142, and a cathode 143 is formed on the overcoat layer 133. The anode 141 is connected with the source electrode or drain electrode of the thin film transistor 120 through the contact hole of the overcoat layer 133. A bank 134 is disposed on both sides of the anode 141. The bank 134 is formed in a tapered shape.

The organic layer 142 is a layer for emitting light and thus formed of an organic light emitting material for emitting light. The organic layer 142 is not limited thereto, and may be formed of materials for emitting lights of various colors. Referring to FIG. 1, the organic layer 142 is formed within the light emitting area AA.

Referring to FIG. 1, the organic layer 142 is disposed as a plurality of columns having different lengths within the light emitting area AA. A length D1 of the outermost column of the plurality of columns is smaller than a length D2 of its adjacent column. In each of the plurality of columns, pixels are disposed. The number of the disposed pixels varies depending on a length of the column. The pixels are disposed such that the number of pixels is increased toward the plurality of columns at center. Therefore, the lengths of the plurality of columns are gradually increased. Further, a line connecting the outer periphery of the organic layer 142 has a substantially circular shape. The light emitting area AA is also defined as a circular shape corresponding to the area of the organic layer 142.

FIG. 2 is a cross-sectional view of the organic layer 142 of the organic light emitting display apparatus 100 cut along a longitudinal direction. Referring to FIG. 2, the organic layer 142 is disposed over a plurality of anodes 141. Further, the organic layer 142 is formed to an end portion of the light emitting area AA.

If a thin film deposition mask including slits having the same length is used according to the prior art, a material of an organic layer may be formed beyond the light emitting area AA and thus may be formed on the bezel area BA. The material of the organic layer formed on the bezel area BA may connect conductive materials such as a VSS wiring and the cathode or form a current leakage path from the organic layer. Therefore, the material of the organic layer formed on the bezel area BA may deteriorate reliability of an organic light emitting display apparatus.

However, the organic layer 142 of the organic light emitting display apparatus 100 according to an exemplary embodiment of the present disclosure is formed by using a thin film deposition mask including slits having different lengths. Therefore, the organic layer 142 can be formed only on a target area. Since it is possible to avoid problems caused by extra material of the organic layer 142, reliability of the non-rectangular organic light emitting display apparatus 100 can be improved.

Further, the organic light emitting display apparatus 100 includes the dummy organic layer 142a adjacent to the outermost column of the plurality of columns. The dummy organic layer 142a is a structure provided by the thin film deposition mask according to an exemplary embodiment of the present disclosure. The dummy organic layer 142a is provided to form the organic layer 142 to have uniform thickness on the entire surface of the substrate 110. The dummy organic layer 142a is disposed parallel to the organic layer 142. The dummy organic layer 142a has the same length D1 as the organic layer 142 in the outermost column. The dummy organic layer 142a is disposed on both sides of the organic layer 142 in the outermost column.

FIG. 3 is a cross-sectional view of the organic light emitting display apparatus 100 cut along a perpendicular direction to the longitudinal direction of the organic layer 142. The dummy organic layer 142a formed parallel to the organic layer 142 may be disposed in the bezel area BA. FIG. 3 illustrates that the dummy organic layer 142a is disposed on the passivation layer 132, but is not limited thereto. The dummy organic layer 142a may be disposed on the overcoat layer 133 and may be partially in contact with the cathode 143. However, the dummy organic layer 142a is not disposed in an area where the cathode 143 is connected with the VSS wiring. Further, FIG. 1 illustrates the dummy organic layer 142a as a single column, but is not limited thereto. The dummy organic layer 142a may be formed into a plurality of columns. The dummy organic layer 142a may have different thickness from that of the organic layer 142.

The dummy organic layer 142a functions as a stabilization layer at the initial stage of forming organic layer 142 in order to form a uniform thickness. The dummy organic layer 142a is formed prior to forming the organic layer 142 within the light emitting area AA. Then, the organic layer 142 is formed in sequence from the outermost column to the center column. Therefore, the organic layer 142 in the outermost column has relatively uniform thickness compared to the case in which the dummy organic layer 142a that is formed at the initial stage of a forming process is absent. In the non-rectangular organic light emitting display apparatus 100 according to an exemplary embodiment of the present disclosure, it is possible to realize the organic layer 142 having more uniform thickness by using the dummy organic layer 142a.

The cathode 143 is formed on the organic layer 142. If the organic light emitting display apparatus 100 is of a top emission type, the cathode 143 is formed of a very thin metal material or transparent conductive oxide (TCO) having a low work function. If the cathode 143 is formed of a metal material, the cathode 143 has a thickness of several hundred Å or less. If the cathode 143 has such thickness, the cathode 143 becomes a substantially semi-transmissive layer and thus becomes a substantially transparent layer.

An encapsulation part may be formed on the organic light emitting element 140. The encapsulation part may have a thin film encapsulation structure in which an organic material layer and an inorganic material layer are alternately laminated. In the thin film encapsulation structure, the inorganic material layer protects the organic light emitting element 140 from moisture, air or physical shock which may be infiltrated from the outside. The organic material layer is configured to cover impurities or particles which may be produced during a process.

FIG. 1 illustrates the organic light emitting display apparatus 100 as a top emission organic light emitting display apparatus 100, but is not limited thereto. The organic light emitting display apparatus 100 may be a bottom emission type in which light emitted from an organic layer is released toward a substrate on which a thin film transistor is formed.

Figure 4:
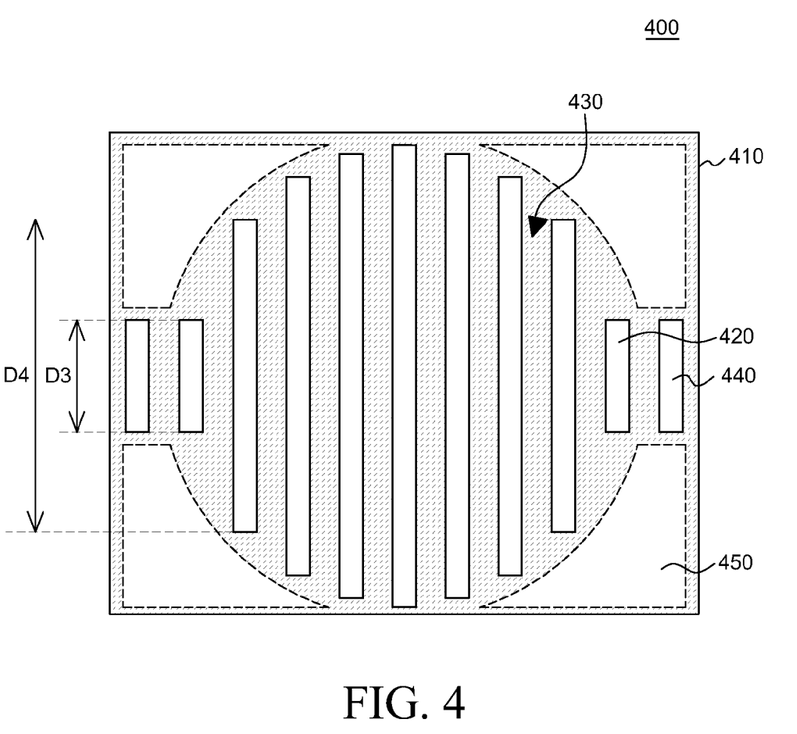
FIG. 4 is a schematic plan view of a thin film deposition mask for manufacturing an organic light emitting display apparatus according to an exemplary embodiment of the present disclosure.

FIG. 4 is a schematic plan view of a thin film deposition mask for manufacturing an organic light emitting display apparatus according to an exemplary embodiment of the present disclosure. A thin film deposition mask 400 is a mask used in a process for depositing the organic layer 142 of the organic light emitting display apparatus 100 described above with reference to FIG. 1 to FIG. 3. The process using the thin film deposition mask 400 is not particularly limited as long as a material of an organic layer is deposited in sequence from one side of the mask.

Referring to FIG. 4, the thin film deposition mask 400 includes a base 410 and a slit portion. The base 410 may be formed of nickel, a nickel alloy, or other metals. The slit portion includes a plurality of slits 420 penetrating the base 410, having different lengths D3 and D4, and formed in parallel to each other. A rib 430 is formed between the slits 420. A length of the rib 430 may vary depending on a length of the slit 420. The plurality of slits 420 is disposed such that the lengths of the slits 420 are increased toward the plurality of slits at center. Further, a line connecting the plurality of slits 420 has a circular shape, and the slit portion may have a circular shape when viewed from above.

Further, the slit portion includes at least one dummy slit 440 for forming a dummy organic material layer and improving thickness uniformity of the organic layer. The dummy slit 440 is parallel to the plurality of slits 420 and has the same length D3 as the outermost slit 420. The dummy slit 440 is disposed on both sides of the plurality of slits 420. That is, the plurality of slits 420 may be disposed symmetrically around the center.

A material of the organic layer may be first deposited through the dummy slit 440. In this case, the material of the organic layer may not be deposited to the desired thickness. However, when an actual organic layer is deposited through the outermost slit 420 having the same length followed by the repeated dummy slits 440, the process may be stabilized. Thus, it is possible to achieve uniform thickness of the organic light emitting display apparatus 100.

Further, the thin film deposition mask 400 includes a buffer 450 disposed adjacent to the slit portion. The buffer 450 may be disposed in an area other than the slit portion, i.e., an area where the plurality of slits 420 is not disposed. The buffer 450 is a portion protruding from the base 410 of the thin film deposition mask 400. The buffer 450 is configured to uniformly increase the widths of the plurality of slits 420 when the thin film deposition mask 400 is stretched before it is disposed for deposition of the organic layer. Accordingly, when the organic layer is formed, thickness uniformity of the organic layer and width uniformity between the columns can be further improved.

Figure 5:
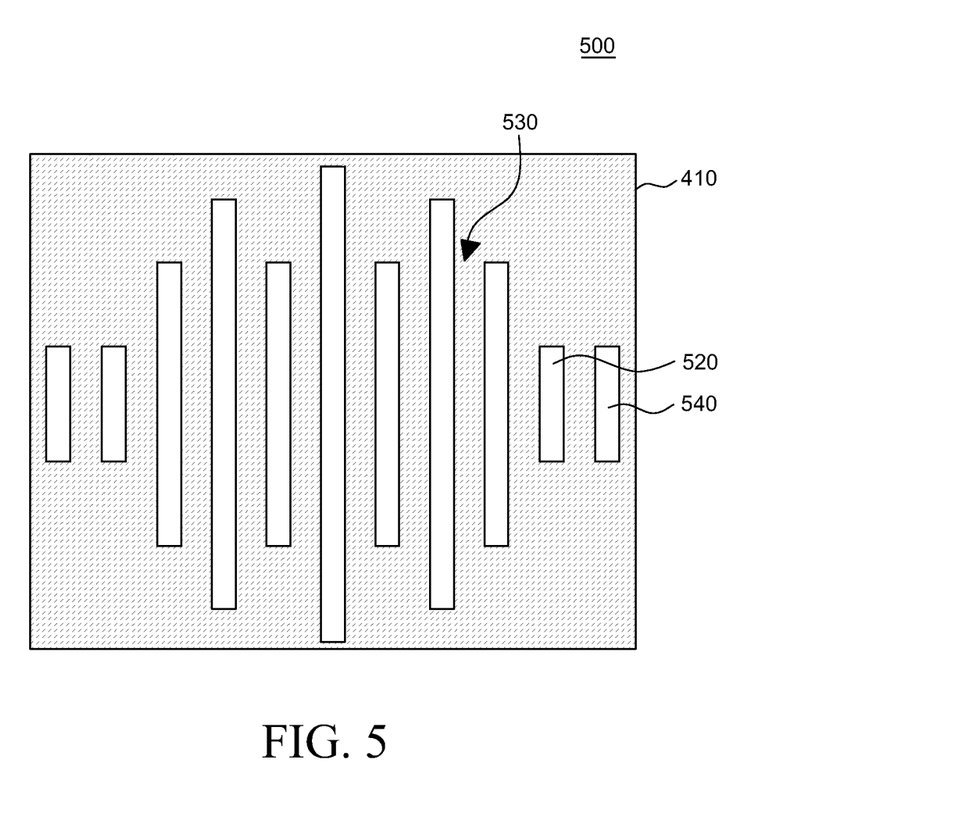
FIG. 5 and FIG. 6 are schematic plan views of thin film deposition masks for manufacturing an organic light emitting display apparatus according to various exemplary embodiments of the present disclosure.
Figure 6:
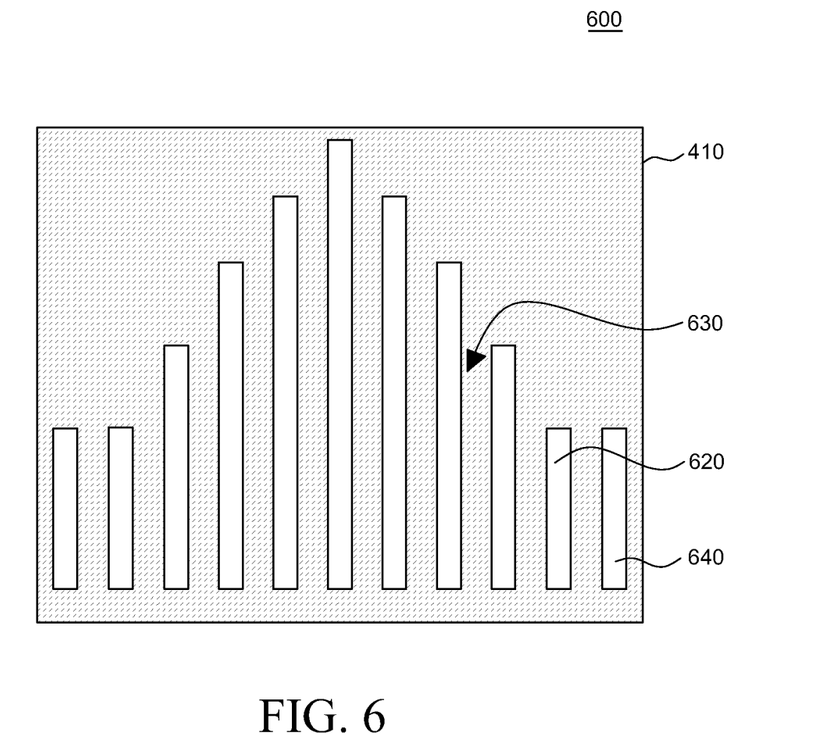

FIG. 5 and FIG. 6 are schematic plan views of thin film deposition masks for manufacturing an organic light emitting display apparatus according to various exemplary embodiments of the present disclosure. The bases 410 and ribs 530 and 630 of thin film deposition masks 500 and 600 illustrated in FIG. 5 and FIG. 6 are substantially the same as the base 410 and the rib 430 illustrated in FIG. 4. Therefore, redundant explanation thereof will be omitted. Further, although illustration of a buffer is omitted from FIG. 5 and FIG. 6, the buffer may be formed on the base 410 without limitation.

In order to manufacture organic light emitting display apparatuses of various shapes, the thin film deposition masks 500 and 600 may include slit portions of various shapes. The slit portions may include a plurality of slits 520 and 620 having different lengths and disposed in a desired pattern. Thus, an organic layer including a plurality of columns can be formed into various polygonal shapes.

Referring to FIG. 5, the plurality of slits 520 is generally increased but partially decreased in length from the outermost periphery toward the center. The slits have the greatest length at the center. Referring to FIG. 6, lower ends of the plurality of slits 620 are disposed side by side. Further, the plurality of slits 620 is increased in length from the outermost periphery toward the center. Since the slits 620 are disposed as such, an organic layer of a polygonal shape can be formed. Further, a thickness deviation of an organic layer can be minimized by using dummy slits 540 and 640.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display apparatus, comprising:
    a substrate including a light emitting area and a bezel area surrounding the light emitting area;
    an organic light emitting element in the light emitting area on the substrate, the organic light emitting element including an organic layer arranged in a plurality of columns; and
    a dummy organic layer positioned on both sides of the organic layer in an outermost column of the plurality of columns,
    wherein the plurality of columns is disposed such that a number of the pixels disposed therein is increased toward the plurality of columns at center,
    wherein the organic layer corresponds to the plurality of columns, and
    wherein the dummy organic layer is adjacent to the outermost column and parallel to the organic layer in the outermost column, and has a same length as the organic layer in the outermost column.

2. The organic light emitting display apparatus of claim 1, wherein the dummy organic layer achieves uniform thickness for the organic layer.

3. The organic light emitting display apparatus of claim 2, wherein the dummy organic layer is a same material as the organic layer.

4. The organic light emitting display apparatus of claim 2, wherein the dummy organic layer is on an overcoat layer and partially in contact with a cathode.

5. The organic light emitting display apparatus of claim 1, wherein the dummy organic layer has different thickness from that of the organic layer.

6. The organic light emitting display apparatus of claim 1, wherein the light emitting area has a circular shape.

7. The organic light emitting display apparatus of claim 1, wherein the light emitting area has a polygonal shape.

8. The apparatus of claim 2, wherein the dummy organic layer contacts with a cathode disposed on the organic layer and is not disposed in an area where the cathode is connected with wiring so as to suppress current leakage.

9. An apparatus comprising:
    a flexible substrate configured for an image display device;
    a matrix of light emitting pixels on the substrate, said matrix having an overall non-rectangular shape with a first set of one or more pixel columns having a different length than a second set of one or more pixel columns; and
    one or more columns of non-emitting dummy pixels adjacent to and along at least two opposing outer edge pixel columns of said matrix, and
    wherein the lengths from the pixel columns at or near the center of the matrix sequentially decrease towards the pixel columns at an edge of the matrix,
    a length of the columns of non-emitting dummy pixels is same as a length of the outer edge pixel columns.

10. The apparatus of claim 9, wherein said dummy pixels contain organic layers initially deposited to determine manufacturing stabilization in achieving uniform thickness for organic layers subsequently deposited in the pixel columns for light emitting pixels.

11. The apparatus of claim 10, wherein the columns of non-emitting dummy pixels are not disposed in an area where a cathode is connected with a VSS wiring.

12. The apparatus of claim 10, wherein said matrix has a circular edge and said flexible substrate is configured within a wearable electronic device.

13. The apparatus of claim 12, wherein said non-rectangular shape is the result of a manufacturing process employing a mask having slits or polygon-shaped openings used in depositing organic layers in the pixel columns on the substrate, said mask having a first set of one or more slits/openings having a different length than a second set of one or more slits/openings.

* * * * *